(12) United States Patent
Dunne

(10) Patent No.: US 6,556,048 B1
(45) Date of Patent: Apr. 29, 2003

(54) HIGH SPEED LOW SKEW LVTTL OUTPUT BUFFER WITH INVERT CAPABILITY

(75) Inventor: Anthony Dunne, Carrigaline (IE)

(73) Assignee: Cypress Semiconductor Corp., San Jose ( * ) Notice: Subject to any disclaimer, the term of this patent is extended or adjusted under 35 U.S.C. 154(b) by 0 days.

(21) Appl. No.: 09/597,099

(22) Filed: Jun. 20, 2000

(51) Int. Cl.[7] .................. H03K 19/0175; H03K 19/094
(52) U.S. Cl. ............................ 326/83; 326/87; 326/86; 326/112; 327/539; 327/543
(58) Field of Search ............... 326/56, 57, 87, 326/112, 83, 86; 327/539, 543; 323/313

(56) References Cited

U.S. PATENT DOCUMENTS

| | | | |
|---|---|---|---|
| 4,701,641 A | * 10/1987 | Harris et al. ................... | 326/37 |
| 5,367,210 A | * 11/1994 | Lipp ........................... | 326/26 |
| 5,517,131 A | * 5/1996 | Tien et al. .................... | 326/34 |
| 5,898,617 A | * 4/1999 | Bushey et al. ............ | 365/185.2 |
| 6,037,803 A | * 3/2000 | Klein .......................... | 326/86 |
| 6,051,995 A | * 4/2000 | Pollachek .................... | 326/87 |
| 6,057,727 A | * 5/2000 | Dautriche et al. .......... | 327/543 |
| 6,218,857 B1 | * 4/2001 | Sharpe-Geisler et al. ..... | 326/39 |
| 6,236,237 B1 | * 5/2001 | Wong et al. .................. | 326/83 |

OTHER PUBLICATIONS

CY7B991 V 3.3V RoboClock, Low Voltage Programmable Skew Clock Buffer, Cypress Semiconductor Corporation, Oct. 20, 1998, pp. 1–12.

CY7B991 CY7B992 Programmable Skew Clock Buffer, Cypress Semiconductor Corporation, Nov. 1991—Revised Jul. 7, 1997, pp. 1–14.

* cited by examiner

Primary Examiner—Michael G. Lee
Assistant Examiner—Steven S. Paik
(74) Attorney, Agent, or Firm—Christopher P. Maiorana, P.C.

(57) ABSTRACT

A prebuffer circuit configured to generate one or more output control signals in response to one or more current sources and an input signal. The one or more output control signals may reduce a process dependent charge to discharge skew.

19 Claims, 3 Drawing Sheets

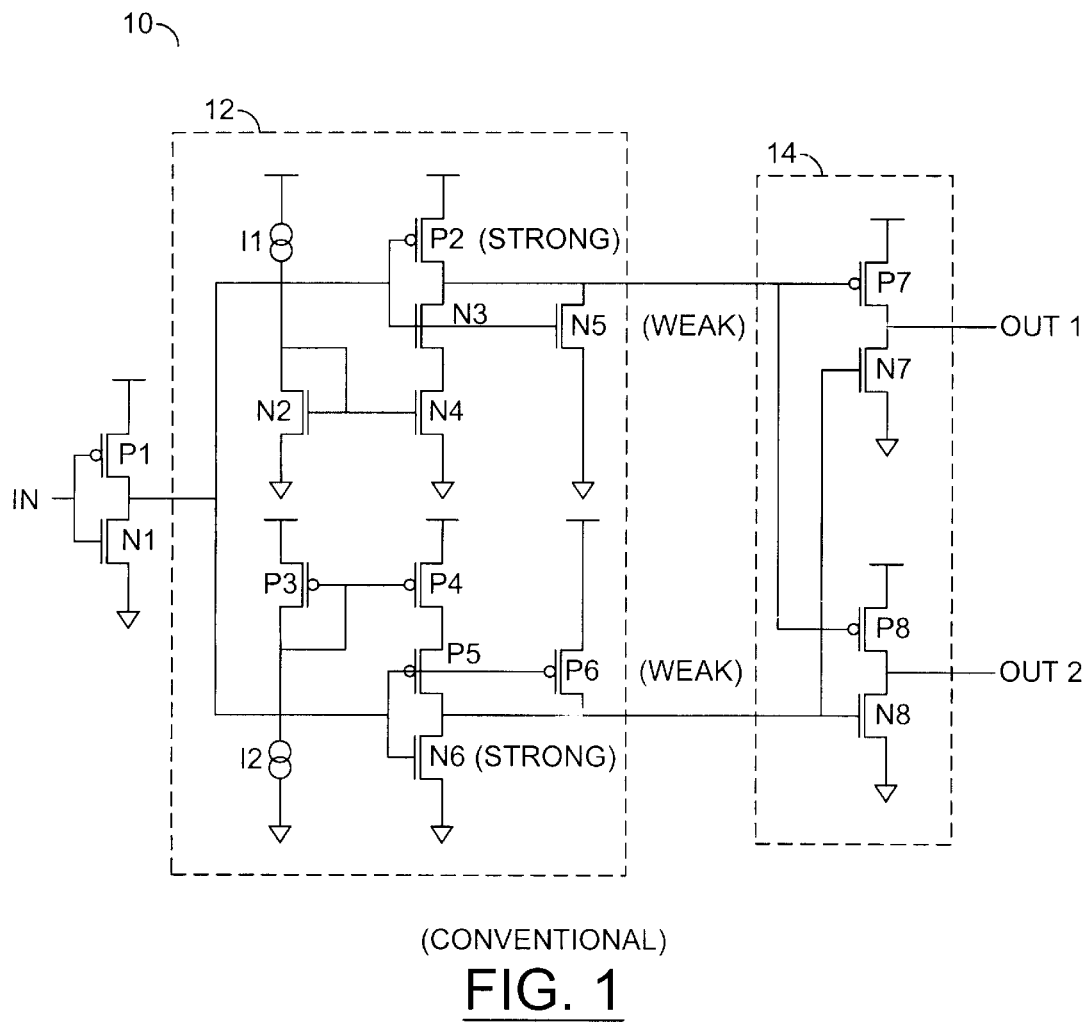
(CONVENTIONAL)
FIG. 1

HIGH SPEED LOW SKEW LVTTL OUTPUT BUFFER WITH INVERT CAPABILITY

FIELD OF THE INVENTION

The present invention relates to a method and/or architecture for implementing an output buffer generally and, more particularly, to a method and/or architecture for implementing a high speed, low skew low voltage transistor-transistor logic (TTL) output buffer with invert capability.

BACKGROUND OF THE INVENTION

Conventional approaches for implementing output buffers use a prebuffer section to control rise and fall rates of gate voltages. Referring to FIG. 1, a schematic of a circuit 10 illustrating such an approach is shown. The circuit 10 comprises a prebuffer 12 and an I/O circuit 14. The prebuffer 10 comprises a current source I1, a current source I2, a number of MOSFETs P1–P8 and a number of MOSFETs N1–N8. The circuit 10 receives the signal IN. The circuit 10 generates the signal OUT1 and the signal OUT2. A current on the signals OUT1 and OUT2 (presented to output capacitors, not shown) has the relationship of i=cdv/dt. By limiting the transient current of the signals OUT1 and OUT2, by controlling a turn on rate of the MOSFETs P7, N7, P8 and N8, the likelihood of rapid rates of change of current in the power and ground inductances is reduced. In turn, a ground or power bounce voltage via the relationship v=ldi/dt is reduced. The prebuffer section 12 also causes the output device P7 connected to the output OUT1 to shut off before the MOSFET N7 turns on, limiting crowbar current in the MOSFET P7 and the MOSFET N7.

The prebuffer 12 operates as follows:

(i) if the MOSFET P7 is on and the MOSFET N7 is off, then the MOSFET N3, the MOSFET N4 and the MOSFET N5 are on, while the MOSFET P2 remains off;

(ii) if the signal IN goes high, the MOSFET N3 and the MOSFET N5 turn off immediately, while the MOSFET P2 turns on fast and the MOSFET P7 shuts off fast. At the same time, the MOSFET N6 turns off fast and the MOSFET P6 begins to pull the gates of the MOSFET N8 and N7 high. The gates of the MOSFET N7 and N8 are pulled high slowly, since the MOSFET P6 is a weak MOSFET.

The weak MOSFET P6 is also assisted by the current source I2 and a current mirror (i.e., the MOSFET P3, the MOSFET P4, and the MOSFET P5). When the weak MOSFET P6 is assisted by the current mirror, the MOSFET P7 and the MOSFET P8 turn off fast, while the MOSFET N7 and the MOSFET N8 turn on slowly. The MOSFET N7, the MOSFET N8 turn off fast in the opposite direction with the MOSFET P7 and the MOSFET P8 turning on slowly.

The MOSFET N5 and P6 are sized to barely operate correctly in the fast process temperature and VCC and corner. In the slow corner, the current sources I1 and I2 supply additional current drive to ensure proper operation. The voltage rate of change at the gates of the output MOSFETs P7, N7, P8 and N8 is as slow as possible during turn on, while still maintaining correct operation. The prebuffer 12 requires the current sources I1 and I2 to vary with temperature and supply variations. The current sources I1 and I2 are made temperature and supply dependent to enable the prebuffer section 12 to operate correctly. The temperature and supply dependencies are implemented to ensure a slow enough turn on of the output MOSFETs P7 and N8, while still ensuring operation in the slow corner.

Conventional prebuffers are very difficult to design and optimize. Conventional prebuffers require significant updating with each new process version. Additionally, if an inverting scheme is to be implemented, then accurate matching of P and N channel MOSFETs is required for accurate skew and duty cycle performance. Furthermore, the accurate matching of P and N channel MOSFETs is not practical.

SUMMARY OF THE INVENTION

The present invention concerns a prebuffer circuit configured to generate one or more output control signals in response to one or more current sources and an input signal. The one or more prebuffer output control signals may reduce a process dependent charge to discharge skew.

The objects, features and advantages of the present invention include providing a method and/or architecture for implementing a high speed, low skew, low voltage (e.g., MOSFET-MOSFET logic (TTL)) output buffer with optional inverting capability that may (i) provide a charge to discharge of an output device that may be less process dependent, (ii) provide current sources that may be derived from a same bandgap source (e.g., allowing slow charge and discharge times to be better matched), (iii) allow the current sources to be derived by forcing an internally generated bandgap voltage across an external resistor to generate current sources that may not be dependent on a process absolute resistor value, (iv) allow the current sources to be VCC, process and temperature dependent to further reduce signal variation, (v) provide a well controlled duty cycle for an inverted implementation and/or (vi) provide low skew.

BRIEF DESCRIPTION OF THE DRAWINGS

These and other objects, features and advantages of the present invention will be apparent from the following detailed description and the appended claims and drawings in which:

FIG. 1 is a schematic of a conventional architecture for a buffer;

DETAILED DESCRIPTION OF THE PREFERRED EMBODIMENTS

Figure 2:
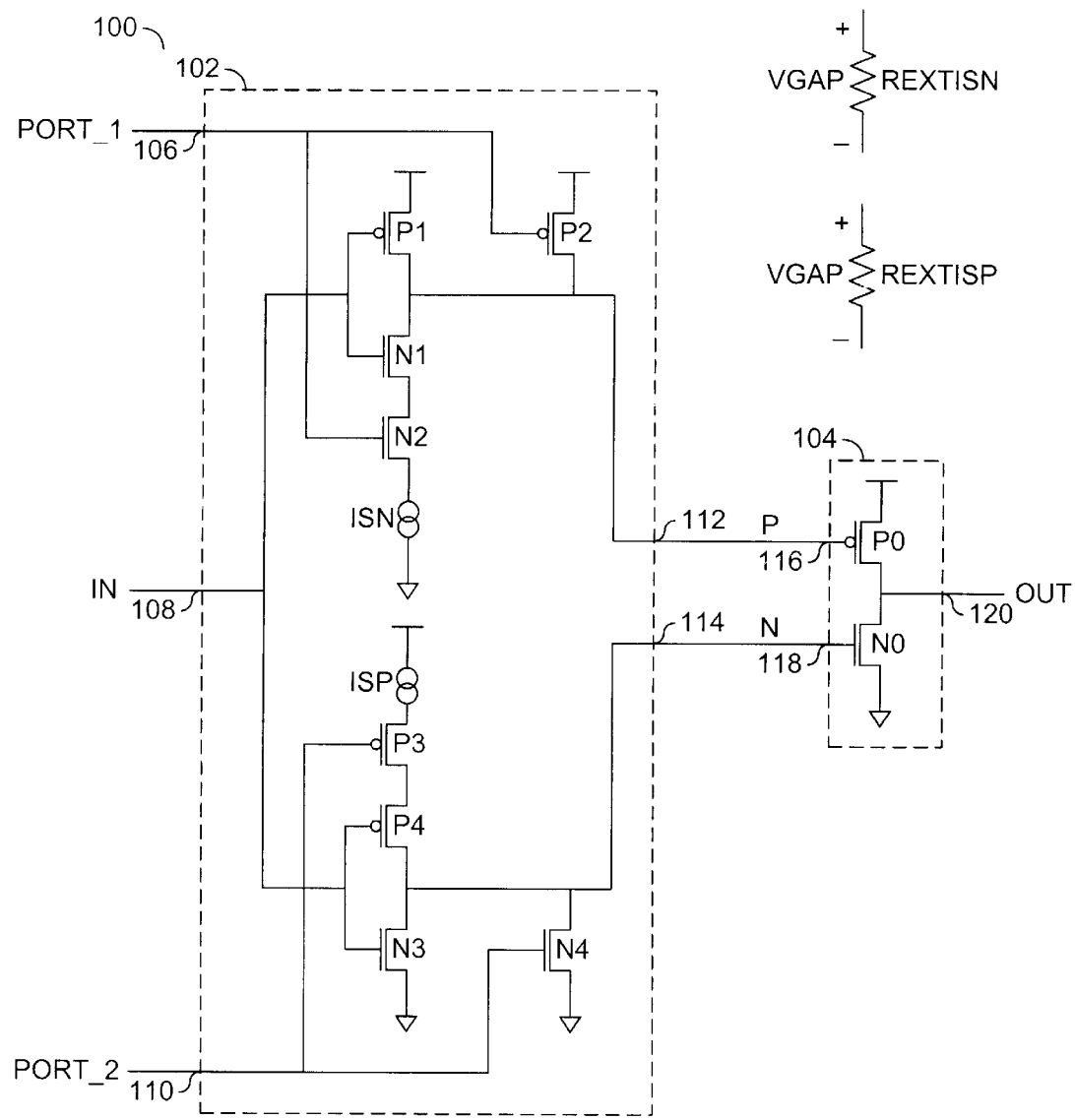
FIG. 2 is a schematic of a preferred embodiment of the present invention.

Referring to FIG. 2, a block diagram of a circuit 100 is shown in accordance with a preferred embodiment of the present invention. The structure of the circuit 100 generally comprises a first portion (or circuit) 102 and a second portion (or circuit) 104. The circuit 102 may be implemented as an input section. The circuit 104 may be implemented as an output section. The circuit 102 may have an input 106 that may receive a first signal (e.g., PORT_1), an input 108 that may receive an input signal (e.g., IN), an input 110 that may receive a signal (e.g., PORT_2), an output 112 that may present a signal (e.g., P) and an output 114 that may present a signal (e.g., N). The circuit 104 may have an input that may receive the signal P, an input that may receive the signal N and an output that may present a signal (e.g., OUT).

The circuit 100 may be implemented as a low voltage transistor-transistor logic (LVTTL) output buffer. The LVTTL output buffer 100 may be implemented to provide output signals that meet the LVTTL output specification (e.g., 0.4V to 2.4V while driving a load of 50 ohms to VCC/2 in parallel with a capacitor load of 25 pF to ground up to a 200 MHz (or perhaps higher) rate. Output rates may be controlled to minimize power and ground bounce voltages. The circuit 100 may be implemented to control a skew of the output signal OUT with respect to another similar output.

The circuit 102 may be implemented as a prebuffer and the circuit 104 may be implemented as an output buffer. The circuit 102 generally comprises a device (or MOSFET) P1, a device (or MOSFET) P2, a device (or MOSFET) P3, a device (or MOSFET) P4, a device (or MOSFET) N1, a device (or MOSFET) N2, a device (or MOSFET) N3, a device (or MOSFET) N4, a current source Isn, and a current source Isp. The circuit 104 generally comprises a device (or MOSFET) P0 and a device (or MOSFET) N0. The circuit 100 may be implemented without the so called weak devices discussed in the background section.

The MOSFET P0 may shut off fast when a gate of the MOSFET P1 is being pulled down quickly. Additionally, the gate of the MOSFET P0 may turn on slowly when the current source Isn discharges the gate capacitance of the MOSFET P0. Similarly, the MOSFET N0 may shut off fast when a gate of the MOSFET N3 is being pulled up quickly. The gate of the MOSFET N0 may turn on slowly when the MOSFET P3 and P4 are turned on, allowing the current source Isp to charge a gate capacitance of the MOSFET N0.

Such a fast turn off and slow turn on may allow the circuit 100 to avoid crowbar current problems. The turn on of the output devices P0 and N0 may be well controlled by bandgap derived current sources (e.g., Isn and Isp), charging and discharging the gate capacitance of the devices N0 and P0, respectively. The devices P2 and N4, together with the devices N2 and P3 may enable a tristate capability of the circuit 100.

Figure 3:
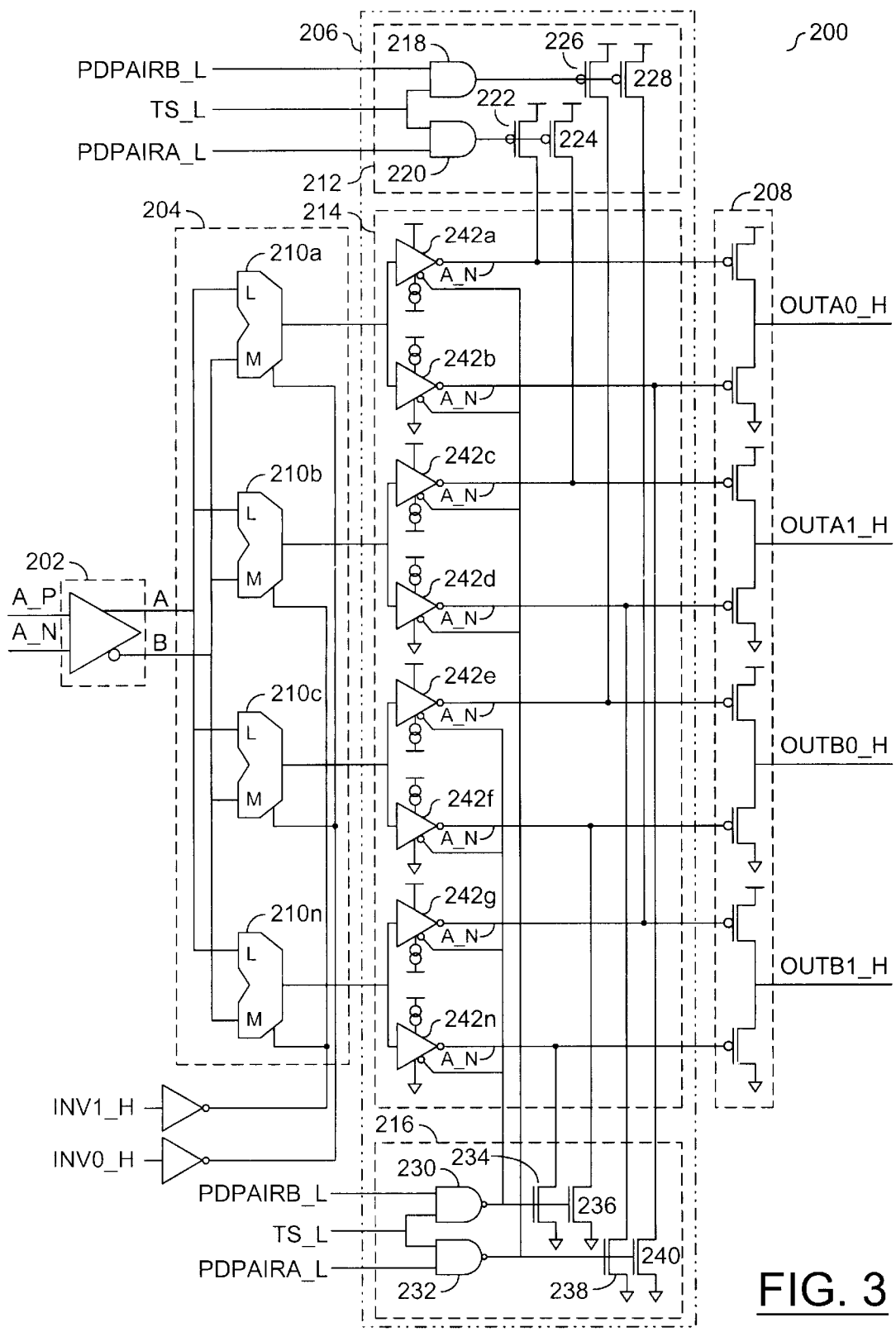
FIG. 3 is a detailed block diagram of an implementation of the present invention.

Referring to FIG. 3, an example implementation of a circuit 200 in accordance with the present invention is shown. The circuit 200 generally comprises a section 202, a section 204, a section 206 and a section 208. The section 202 may be implemented as an input section. The section 202 generally comprises a translator for translating different input level signals to CMOS levels. The section 204 may be implemented as a multiplexer section. The section 206 may be implemented as a prebuffer section. The section 208 may be implemented as an output section.

The section 204 generally comprises a number of multiplexers 210a–210n. The section 206 generally comprises a logic section 212, a prebuffer section 214 and a logic section 216. The logic section 212 generally comprises a gate 218, a gate 220, a MOSFET 222, a MOSFET 224, a MOSFET 226 and a MOSFET 228. The gates 218 and 220 are shown implemented as AND gates. However, other gates may be implemented accordingly to meet the design criteria of a particular implementation. The gate 218 may have a first input that may receive a signal (e.g., PDPAIRB_L) and a second input that may receive a signal (e.g., TS_L). The gate 220 may have a first input that may receive the signal TS_L and a second input that may receive a signal (e.g., PDPAIRA_L). The logic section 216 generally comprises a gate 230, a gate 232, a MOSFET 234, a MOSFET 236, a MOSFET 238 and a MOSFET 240. The gates 230 and 232 are shown implemented as NAND gates. However, other gates may be implemented accordingly to meet the design criteria of a particular implementation. The gate 230 may have a first input that may receive the signal PDPAIRB_L and a second input that may receive the signal TS_L. The gate 232 may have a first input that may receive the signal TS_L and a second input that may receive the signal PDPAIRA_L.

The multiplexers 210a–210n may each have a first input that may receive the signal A and a second input that may receive the signal B. Some of the multiplexers (e.g., 210a and 210c) may receive an inversion of a control signal (e.g., INV0_H). Some of the multiplexers (e.g., 210b and 210n) may receive an inversion of a control signal (e.g., INV1_H).

The prebuffer section 214 may condition the signals received from the multiplexer section 204 before presenting the signals to the output section 208. In one example, the multiplexing for the invert function in the block 204 may be accomplished with CMOS multiplexers. The prebuffer section 214 generally comprises a number of tristate buffers 242a–242n that may control edge rates of signals supplied to the output section 208 as previously described.

The circuit 200 illustrates an overall architecture of a 4 output bank. In one example, the input signals A_P and A_N may be implemented as 400 mv CML level signals. The 400 mv signals may be converted to CMOS level signals by the translator 202. The multiplexers 210a–210n may enable an invert capability of the circuit 200.

The circuit 100 may be implemented as a low voltage transistor-transistor logic (LVTTL) output buffer. The LVTTL output buffer may be implemented to provide output signals that meet the LVTTL output specification (e.g., 0.4V to 2.4V while driving a load of 50 ohms to VCC/2 in parallel with a capacitor load of 25 pF to ground up to a 200 MHz rate). The circuit 100 may enable a pair of prebuffer output signals (e.g., the signals P and N) to be in phase with each other. However, output rates may be controlled to minimize power and ground bounce voltages. Additionally, the circuit 100 may control skew at the output with respect to another similar output.

The circuit 100 (or 200) may provide a charge/discharge of gate capacitance of a number of output devices that may be current source controlled. Previous output buffers utilize a resistance of an MOS device with minimal current source assistance for compensation. Additionally, the circuit 100 may provide (i) tristating and (ii) power down capability.

The circuit 100 may provide a simple output buffer operation. The circuit 100 may allow a charge/discharge of the gates of the output devices P0 and N0 to be less process dependent. The circuit 100 may allow the current sources Isn and Isp to be derived from a same bandgap source. The current sources Isn and Isp may result in slow charge and discharge times that may be accurately matched. This gives a well controlled duty cycle and skew for the invert case compared to the older implementation.

The current sources Isn and Isp may be derived by forcing an internally generated bandgap voltage (e.g., $V_{gap}$) across an external resistor (e.g., $Rext_{ISN}$, $Rext_{ISP}$) to generate currents that are not dependent on a process absolute resistor value. The current sources Isn and Isp may be made VCC, process and temperature dependent to reduce further signal variation.

In one alternate example, the multiplexing for the invert function of the block 204 may be accomplished in CML rather than with CMOS muxes. In another alternate example, the multiplexing of the block 204 may be accomplished in the prebuffers section 206. The implementation of the multiplexing within the prebuffers section 206 may have an increased area and/or increased power consumption.

In another alternate example, the currents sources Isn and Isp may also be compensated for (e.g., VCC, process and temperature dependent). In another alternate example, the current source switching may be accomplished by shutting down the gates of the current sources Isn and Isp. However, shutting down of the gates may result in an associated tristate speed penalty.

In another alternate example, the current sources Isn and Isp may be controlled by a current source digital analog converter (DAC). The DAC may allow an output edge rate to be reduced. The DAC may allow programmable edge rates that may be configured to reduce EMI at lower frequencies. In another alternate example, the current sources Isn and Isp may include nonvolatile, laser or fuse trimming for precise current and edge rate control.

The circuit 100 may provide pure (e.g., constant) current sources configured to drive the gates of output devices. The pure current sources may enable excellent control of a duty cycle and skew in an inverted mode of operation. The circuit 100 may allow the pure current sources that may enable simple compensation schemes for process, temperature and VCC variations as well as simple control of edge rates if desired.

The circuit 100 may control ground and power bounce voltages at high frequencies. The ground and power bounce voltage may be a difficult problem, common to all high frequency ICs that are outputting large signals such as CMOS or LVTTL devices.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a plurality of multiplexers configured to generate a plurality of input signals each in response to multiplexing a first signal and a second signal, wherein (i) said second signal is an inverse of said first signal, (ii) a first of said multiplexers is controlled by a first invert signal and (iii) a second of said multiplexers is controlled by a second invert signal; and
   a plurality of prebuffer circuits each configured to generate a plurality of output control signals in response to (i) a plurality of current sources and (ii) one said input signal, wherein said output control signals reduce a process dependent charge to discharge skew.

2. The circuit according to claim 1, wherein said output control signals are generated with a low ground and power bounce voltage configured to minimize noise and skew for different frequencies.

3. The circuit according to claim 1, wherein each of said prebuffer circuits is further configured to reduce crowbar current.

4. The circuit according to claim 1, wherein said current sources are adjustable.

5. The circuit according to claim 1, further comprising a plurality of output devices configured to receive said output control signals.

6. The circuit according to claim 5, wherein said current sources are each configured to drive a gate of said output devices.

7. The circuit according to claim 5, wherein said current sources are configured to enable control of a duty cycle and a skew of said output control signals.

8. The circuit according to claim 5, wherein said current sources are configured to enable compensation for process conditions, supply variations and control of edge rates.

9. The circuit according to claim 5, wherein said current sources are configured to enable compensation for temperature conditions.

10. The circuit according to claim 5, wherein said current sources are configured to enable compensation for voltage and process variations.

11. The circuit according to claim 5, wherein said current sources are configured to provide control of one or more edge rates of said output control signals.

12. The according to claim 11, wherein said current sources are each controlled by a digital to analog converter.

13. The circuit according to claim 1, wherein said output control signals each comprise an output signal that is about 0.4V to 2.4V while driving a load of about 50 ohms to about VCC/2 in parallel with a capacitor load of about 25 pF to ground up to about 200 MHz rate.

14. The circuit according to claim 1, wherein each of said current sources is derived by forcing an internally generated bandgap voltage across an external resistor.

15. A method for generating a plurality of output control signals comprising the steps of:
   (A) generating a plurality of input signals each in response to multiplexing a first signal and a second signal, where (i) said second signal is an inverse of said first signal, (ii) a first of said multiplexes is controlled by a first invert signal and (iii) a second of said multiplexes is controlled by a second invert signal; and
   (B) generating said output control signals in response to (i) a plurality of current sources and (ii) said input signals, wherein said output control signals reduce a process dependent charge to discharge skew.

16. The method according to claim 15, further comprising the step of generating said output control signals with a low ground and power bounce voltage.

17. The method according to claim 16, wherein said low ground and power bounce voltage minimizes noise and skew for different frequencies.

18. The method according to claim 15, wherein said current sources drive a plurality of output devices configured to receive said output control signals.

19. A circuit comprising:
   means for generating a plurality of input signals each in response to multiplexing a first signal and a second signal, where (i) said second signal is an inverse of said first signal, (ii) a first of said multiplexes is controlled by a first invert signal and (iii) a second of said multiplexes is controlled by a second invert signal; and
   means for generating a plurality of output control signals in response to (i) a plurality of current sources and (ii) said input signals, wherein said output control signals reduce a process dependent charge to discharge skew.

* * * * *